(12) United States Patent
Diab

(10) Patent No.: US 6,873,926 B1
(45) Date of Patent: Mar. 29, 2005

(54) METHODS AND APPARATUS FOR TESTING A CLOCK SIGNAL

(75) Inventor: Wael Diab, Menlo Park, CA (US)

(73) Assignee: Cisco Technology, Inc., San Jose, CA (US)

( * ) Notice: Subject to any disclaimer, the term of this patent is extended or adjusted under 35 U.S.C. 154(b) by 389 days.

(21) Appl. No.: 09/794,453

(22) Filed: Feb. 27, 2001

(51) Int. Cl.[7] .................. G01R 27/28; G01R 31/00; G01R 31/14; G01R 19/00; G06F 15/00
(52) U.S. Cl. .................................................. 702/117
(58) Field of Search ...................... 702/117; 713/400; 327/141, 158, 142; 714/738; 375/226

(56) References Cited

U.S. PATENT DOCUMENTS

| | | | | |
|---|---|---|---|---|
| 4,821,287 A | * | 4/1989 | Keiper, Jr. .................. 375/226 |
| 5,225,774 A | * | 7/1993 | Imamura .................. 324/158.1 |
| 5,230,001 A | * | 7/1993 | Chandra et al. ............. 714/744 |
| 5,258,660 A | * | 11/1993 | Nelson et al. ............... 327/141 |
| 5,459,733 A | * | 10/1995 | Alapat ......................... 714/718 |
| 5,489,863 A | * | 2/1996 | Saijo ........................... 327/142 |
| 5,621,739 A | * | 4/1997 | Sine et al. .................. 714/724 |
| 5,869,983 A | * | 2/1999 | Ilkbahar et al. ............... 326/83 |
| 6,476,653 B1 | * | 11/2002 | Matsuzaki ................... 327/158 |
| 6,477,674 B1 | * | 11/2002 | Bates et al. ................. 714/738 |
| 2001/0013100 A1 | * | 8/2001 | Doblar et al. ............... 713/400 |
| 2002/0048326 A1 | * | 4/2002 | Sahlman ..................... 375/297 |

* cited by examiner

*Primary Examiner*—Michael Nghiem
*Assistant Examiner*—Aditya Bhat
(74) *Attorney, Agent, or Firm*—Chapin & Huang, L.L.C.; David E. Huang, Esq.

(57) ABSTRACT

Techniques test a clock signal by comparing different portions of that clock signal to each other. Such techniques enable the detection of a clock signal having anomalies such as missing pulses or occasional delayed pulses. In one arrangement, a data communications device has a clock signal generator, processing circuitry and a test circuit, both of which are coupled to the clock signal generator. The clock signal generator provides a clock signal. The processing circuitry uses the clock signal to receive data elements on a set of input ports, and to transmit the data elements on a set of output ports. The test circuit includes a node that receives the clock signal, a comparison circuit that provides a comparison signal based on a comparison between the clock signal and a delayed copy of the clock signal, and an output circuit that provides a result signal based on the comparison signal.

26 Claims, 7 Drawing Sheets

METHODS AND APPARATUS FOR TESTING A CLOCK SIGNAL

BACKGROUND OF THE INVENTION

A typical computer includes a clock generator that provides accurately timed pulses for synchronization. Some clock generators work off of a crystal, i.e., a natural or synthetic piezoelectric or semiconductor material which controls the frequency of oscillation of the clock signal. For example, some computers include a crystal driven clock generator that provides a system clock, i.e., a global clock signal which guides computer operations.

Clock generators are susceptible to failure. For example, a clock generator may stop providing pulses. Such a failure can be caused by an extreme operating environment (e.g., an excessive heat or humidity condition). Such a failure could also be caused by other factors such as gradual aging of the clock generator components (e.g., the crystal), poor quality components, or a manufacturing defect, etc.

Some computers include a clock detection circuit that monitors the operation of the clock generator. Such a circuit typically provides an error signal when it no longer detects the presence of a clock signal, i.e., when it no longer detects clock pulses from the clock generator. One example of a computer system, which uses such a detection circuit to detect the presence (or subsequent loss) of a system clock, is a conventional data communications device which sends and receives packets of data within a computer network.

SUMMARY OF THE INVENTION

Unfortunately, there are deficiencies to computers which simply include a clock detection circuit for detecting the presence (or loss) of a clock signal. In particular, such a detection circuit may indicate the presence of a clock signal even though the clock signal has anomalies which prevent the computer from operating properly. For example, the detection circuit may indicate the presence of the clock signal if the detection circuit detects a series of rising and falling edges. However, the clock signal may have irregularities such as delayed or missing pulses. In an environment requiring a high speed system clock (e.g., Gigabit Ethernet applications), a clock with such deficiencies essentially renders the computer system prone to malfunction and/or useless.

Moreover, if the delayed or missing pulses occur intermittently within the clock signal, the presence of such anomalies may be expensive or even impossible to identify. Such anomalies tend to increase the cost of maintaining and servicing computer equipment.

One solution may be to provide a detection circuit having a second clock generator that provides a second clock signal to which the first clock signal can be compared. Alternatively, the second clock signal can be used to count the first clock signal. Unfortunately, such solutions simply push the clock problem somewhere else. That is, the second clock generator can itself be a single point of failure, and there are some situations in which having such a single point of failure is unacceptable.

In contrast to the above-identified conventional approaches which involve simply detecting for the presence (or absence) of a clock signal, the invention is directed to techniques for testing a clock signal by comparing different portions of that clock signal to each other (e.g., the actual clock signal and a delayed copy of the clock signal). Such techniques enable the detection of missing pulses or occasional delayed pulses within a clock signal that is present. Furthermore, such techniques can be implemented using simple, low cost components (e.g., delay buffers, an XOR gate, an RC circuit, etc.). Accordingly, more expensive and complex circuits such as Phase-locked Loops are unnecessary. Furthermore, the use of such complex circuits would introduce a higher risk of failure due to the added complexity.

One arrangement of the invention is directed to a data communications device having a clock signal generator, processing circuitry and a test circuit, both of which are coupled to the clock signal generator. The clock signal generator provides a clock signal. The processing circuitry uses the clock signal to receive data elements on a set of input ports, and to transmit the data elements on a set of output ports. The test circuit includes a node that receives the clock signal, a comparison circuit that provides a comparison signal based on a comparison between the clock signal and a delayed copy of the clock signal (e.g., a delayed duplicate of the clock signal), and an output circuit that provides a result signal based on the comparison signal. Accordingly, the test circuit is capable of identifying clock signal anomalies such as indicating the presence of irregularities (i.e., differences) in the clock.

In one arrangement, the comparison circuit includes a delay circuit and compare circuitry coupled to the delay circuit. The delay circuit delays a copy of the clock signal for a predetermined time interval (an integer multiple of the clock period) to form the delayed copy of the clock signal. The compare circuitry compares the clock signal with the delayed copy of the clock signal. In one arrangement, the delay circuit includes a set of delay buffers connected in a cascading manner. In another arrangement, the delay circuit includes an elongated trace of conductive material (e.g., an ASIC trace, an extended length of metallic etch, etc.). In yet another arrangement, the delay circuit includes a voltage controlled delay line, or sometimes simply referred to as a "delay line".

In one arrangement, the comparison circuit includes an XOR circuit having a first input that receives the clock signal, and a second input that receives the delayed copy of the clock signal. The XOR circuit further has an output that provides an output signal having an asserted level when the clock signal and the delayed copy of the clock signal do not instantaneously match, and a de-asserted level when the clock signal and the delayed copy of the clock signal instantaneously match.

In one arrangement, the output circuit includes an RC circuit having an input coupled to the comparison circuit, and an output that provides a tuned signal based on the comparison signal. Such a circuit is well-suited for tuning out noise or insignificant differences between the clock signal and the delayed copy of the clock signal thus building in operating margin and allowing for various levels of accuracy.

In one arrangement, the output circuit includes a trigger circuit having an input coupled to the comparison circuit, and an output that outputs the result signal. The use of a Schmitt trigger, as the trigger circuit, provides reinforcement of the levels coming out of the comparison circuit (clean high and low assertion levels for controlling additional logic circuitry). In one arrangement, the result signal has (i) a constant level when the clock signal and the delayed copy of the clock signal match and (ii) a square pulse when the comparison circuit determines that the clock signal and the delayed copy of the clock signal do not match. In another arrangement, the result signal simply provides a first or "good" assertion level when the clock signal and the delayed copy match, and a second or "bad" assertion level after the clock signal and the delayed copy do not match (e.g., until the test circuit is reset). Accordingly, the result signal is suitable for identifying detection of a clock signal anomaly (e.g., a missed pulse), and for controlling other circuits such as activating an error handling procedure (e.g., activating a latch mechanism that switches over to a backup clock signal generator), etc.

The features of the invention, as described above, may be employed in data communication systems, devices and methods and other computer-related components such as those of Cisco Systems, Inc. of San Jose, Calif.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for testing a clock signal by comparing different portions of that clock signal to each other. Such techniques enable the detection of clock signal irregularities such as a clock signal having missing pulses or having occasional delayed pulses. Accordingly, these techniques can be used to insure the quality of the clock.

Figure 1:
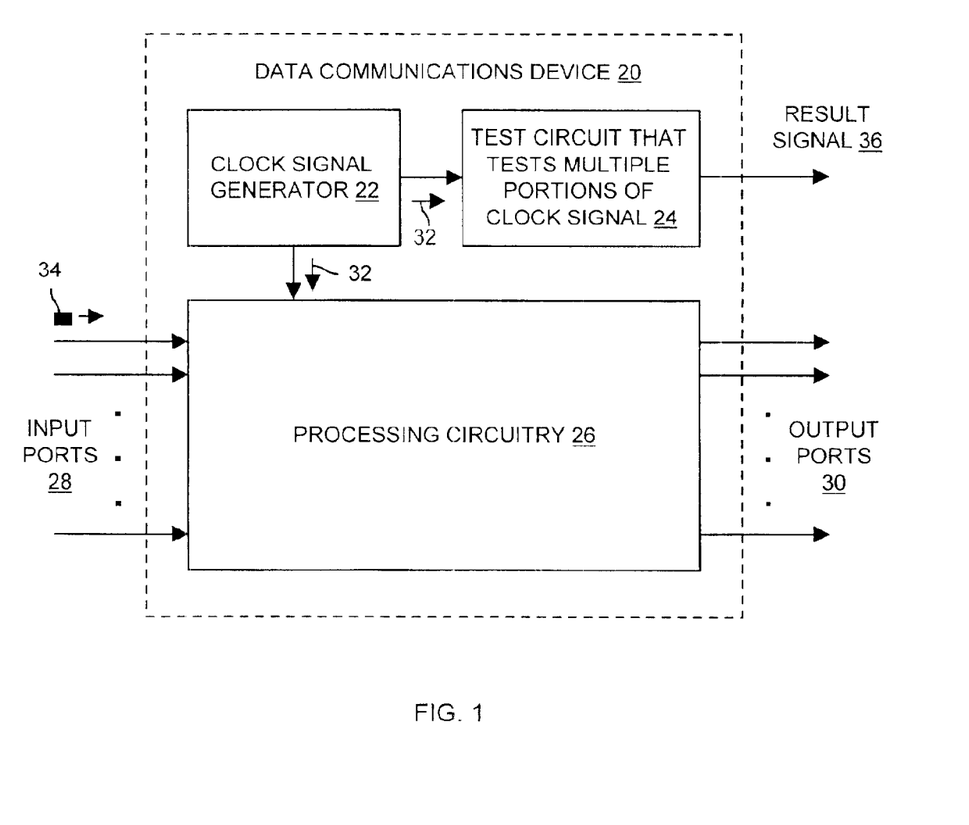
FIG. 1 is a block diagram of a data communications device which is suitable for use by the invention.

FIG. 1 shows a data communications device 20 which is suitable for use by the invention. The data communications device 20 includes a clock signal generator 22, a test circuit 24, and processing circuitry 26. The data communications device 20 further includes a set of input ports 28, and a set of output ports 30.

During operation, the clock signal generator 22 generates a clock signal 32 (e.g., a 125 MHz square wave, a 25 MHz square wave, etc.) which is received by both the test circuit 24 and the processing circuitry 26. The processing circuitry 26 receives data elements of 34 (e.g., packets, cells, frames, etc.) through the set of input ports 28 and transmits data elements 34 through the set of output ports 30 using the clock signal 32. Concurrently, the test circuit 24 tests the clock signal 32 by looking at various portions (i.e., the clock signal 32 and a delayed copy of the clock signal 32) and provides a result signal 36 based on those tests. Further details of the invention will now be provided with reference to FIG. 2.

Figure 2:
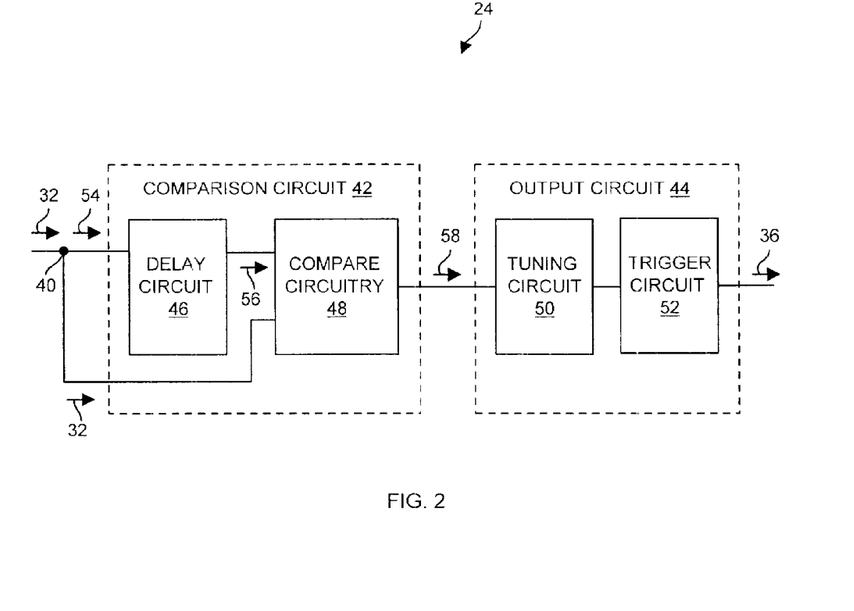
FIG. 2 is a block diagram of a test circuit of the data communications device of FIG. 1.

FIG. 2 is a block diagram of particular components of the test circuit 24 of FIG. 1. The test circuit 24 includes a node 40, a comparison circuit 42, and an output circuit 44. The comparison circuit 42 includes a delay circuit 46 that connects to the node 40, and compare circuitry 48 that connects to the delay circuit 46 and the node 40. The output circuit 44 includes a tuning circuit 50 that connects to the compare circuitry 48 of the comparison circuit 42, and a trigger circuit 52 that connects to the tuning circuit 50.

During operation, the comparison circuit 42 receives the clock signal 32 from the clock signal generator 22 (also see FIG. 1) through the node 40. In particular, the delay circuit 46 receives a copy 54 of the clock signal 32 and provides a delayed copy 56 of the clock signal 54. The delay circuit 46 delays the copy 54 of the clock signal 32 by an integer multiple of the clock period (e.g., five clock periods) to form the delayed copy 56 of the clock signal. The compare circuitry 48 receives both the clock signal 32 and the delayed copy 56 of the clock signal 32, and provides a comparison signal 58 indicating an instantaneous comparison of the clock signal 32 and the delayed copy 56 of the clock signal 32.

The output circuit 44 receives the comparison signal 58 and provides the result signal 36 based on the comparison signal 58. In particular, the tuning circuit 50 provides hysteresis to the comparison signal 58. That is, the tuning circuit 50 adds margin to account for inherent noise (i.e., jitter, duty cycle distortion, and other subtle differences between the clock signal 32 and the delayed copy 56 of the clock signal 32 which are deemed acceptable). Accordingly, the tuning circuit 50 essentially provides a tuned version of the comparison signal 58 for triggering the trigger circuit 52.

It should be understood that a noisier clock may be acceptable in some applications. In one arrangement, the tuning circuit 50 is an RC circuit that enables variation of the resistance and capacitance values (e.g., adjustment of the RC time constant) to obtain a level of tuning that is required or suitable for a particular application. For example, in a high speed network application, a crisp and minimal-noise clock signal may be required. Accordingly, the tuning circuit 50 can be adjusted to provide minimal tuning so that even small variations in the clock signal 32 cause the trigger circuit 52 to trigger. As another example, in a fairly general purpose application (e.g., a desktop computer application), noise in the clock signal is less critical but still a concern. Accordingly, the tuning circuit 50 can be adjusted to provide more moderate tuning that causes triggering of the trigger circuit 52 primarily in severe situations (e.g., missing clock pulses). Further details of the operation of the test circuit 24 will now be provided with reference to FIG. 3.

Figure 3:
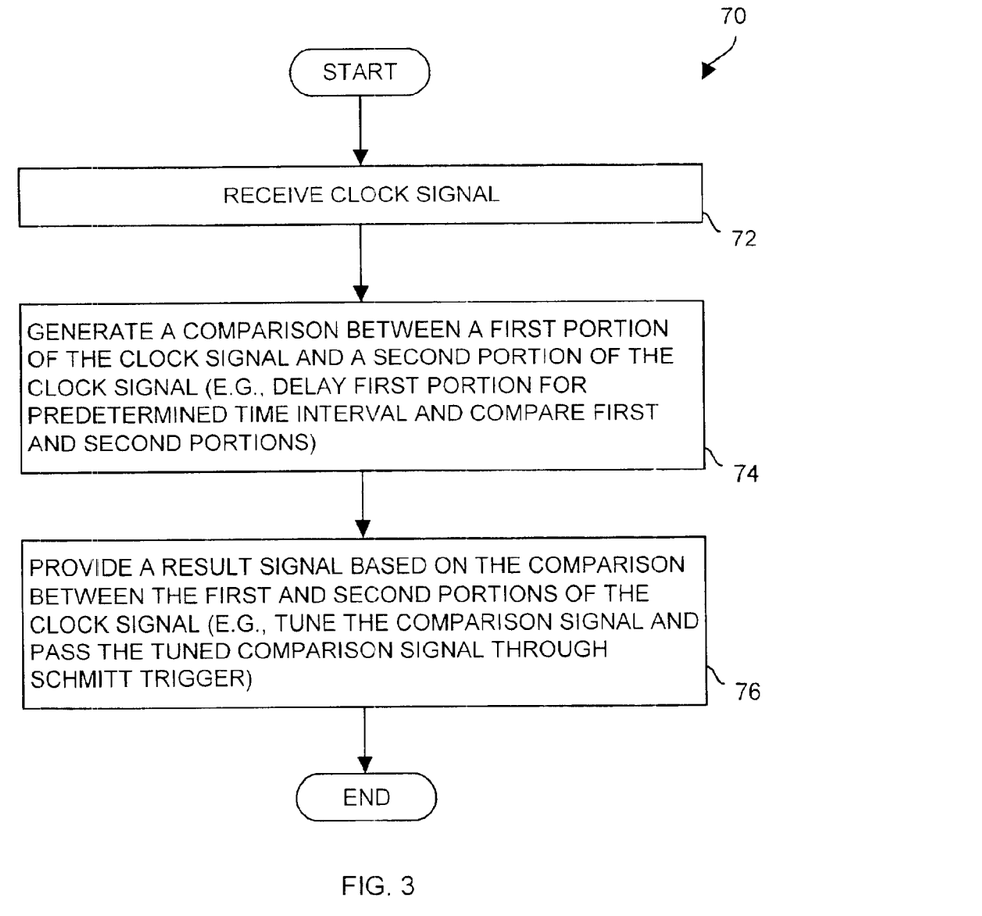
FIG. 3 is a flowchart of a procedure performed by the test circuit of FIG. 2.

FIG. 3 shows a procedure 70 which is performed by the test circuit 24 of FIG. 2. In step 72 the node 40 receives the clock signal 32. Step 72 preferably occurs while the data communications device 20 runs in a normal operating mode, e.g., while the processing circuitry 26 sends and receives data elements 34 using the clock signal 32 for synchronization, reception and/or retransmission (also see FIG. 1).

In step 74, the comparison circuit 42 generates a comparison between the clock signal 32 and the copy 56 of the clock signal 32. In particular, the delay circuit 46 of the comparison circuit 42 delays the copy 54 of the clock signal 54 for a predetermined time interval (an integer multiple of clock periods). The compare circuitry 48 then compares the delayed copy 56 of the clock signal 32 (a first portion of the clock signal 32) with the actual clock signal 32 (a second portion), and generates the comparison signal 58 indicating whether the delayed copy 56 of the clock signal 32 and the actual clock signal 32 match.

In step 76, the output circuit 44 provides the result signal 36 based on the comparison signal 58. In particular, the tuning circuit 50 of the output circuit 44 filters out marginal differences (e.g., noise) between the delayed copy 56 of the clock signal 32 and the actual clock signal 32. The trigger circuit 52 provides, as the result signal 36, a filtered or glitch free output which is well-suited for use as an input signal to another circuit (e.g., to activate a warning lights, to trigger an entry into a log file, to activate a backup clock signal generator, etc.).

It should be understood that steps 72, 74 and 76 occur concurrently. That is, as the node 40 receives subsequent portions of the clock signal 32 (step 72), the comparison circuit 42 is operating on earlier portions of the clock signal 32, and the output circuit 44 is operating based on even earlier portion of the clock signal 32.

It should be further understood that the procedure 70 provides a higher level of checking than simply reporting whether a clock signal is present, as in conventional computer systems. The procedure 70 verifies the quality of an existing clock signal which is fundamental to the reliable operation of a computer, particularly those involved in network communications. Further details of the invention will now be provided with reference to FIGS. 4 through 6.

Figure 4:
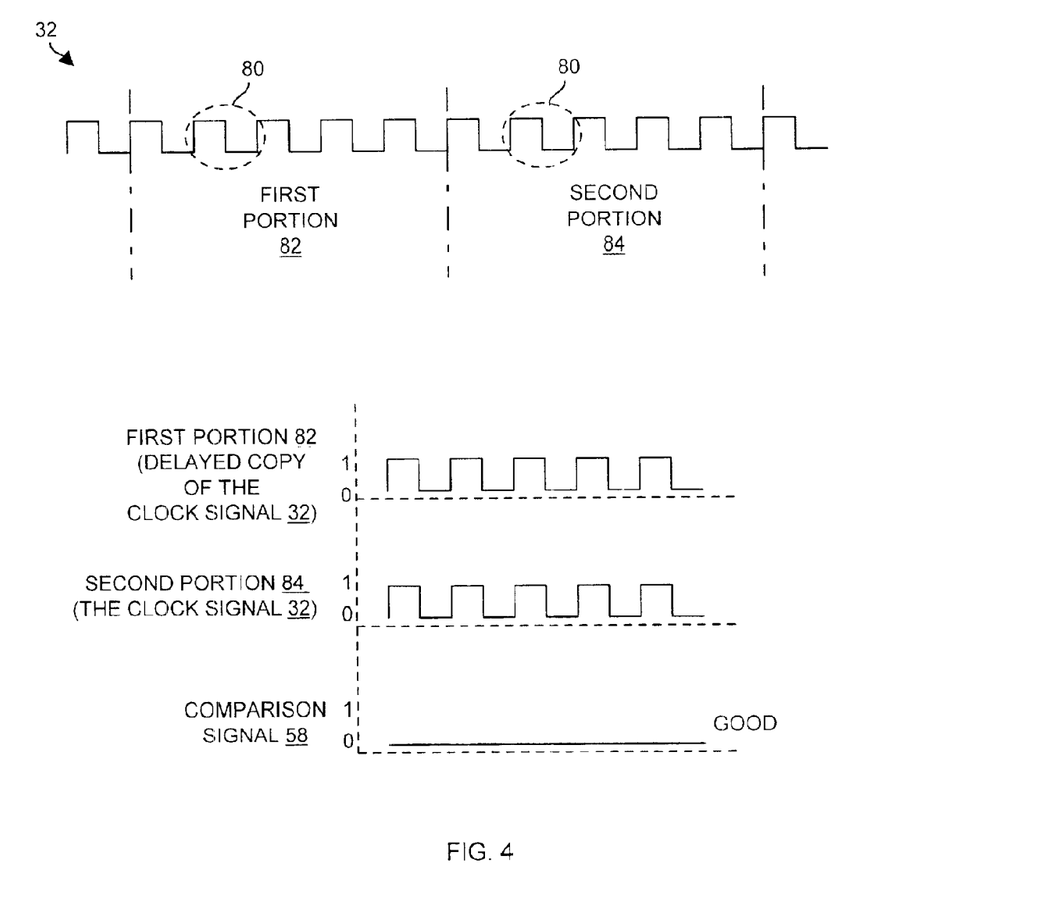
FIG. 4 is a timing diagram of a clock signal tested by the test circuit of FIG. 1 when the clock signal passes a test.

FIG. 4 shows an example of how the comparison circuit 42 of FIG. 2 generates the comparison of the clock signal 32 and the delayed copy 54 of the clock signal 32. As shown in the example, the clock signal 32 is stable and has a uniform waveform 80. By way of example and in connection with FIGS. 4 through 6, suppose that the delay circuit 46 of the comparison circuit 42 provides a delay of five clock periods. As such, the compare circuitry 48 compares portions, or segments, the clock signal 32 which are five clock periods apart. As illustrated in the lower timing diagram of FIG. 4, the compare circuitry 48 compares the clock signal 32 (also see the beginning of the second clock signal portion 84 in the upper timing diagram) and a copy of the clock signal 32 which is delayed by five clock periods (also see the beginning of the first clock signal portion 82). In the case of FIG. 4, where the clock signal 32 includes a consistent and jitter-free series of uniform waveforms 80, the comparison signal 58 indicates that the clock signal 32 is acceptable (e.g., "GOOD"). That is, the comparison signal 58 does not include any pulses across five tested clock cycles because the clock signal 32 and the delayed copy of the clock signal 32 instantaneously matched during those five clock cycles.

It should be understood that the comparison circuit 42 continues to operate on the clock signal 32 during operation of the data communications device 20 of FIG. 1. Accordingly, the compare circuitry 48 continuously tests the clock signal 32 and outputs the comparison signal 58 while the data communications device 20 is in operation.

Figure 5:
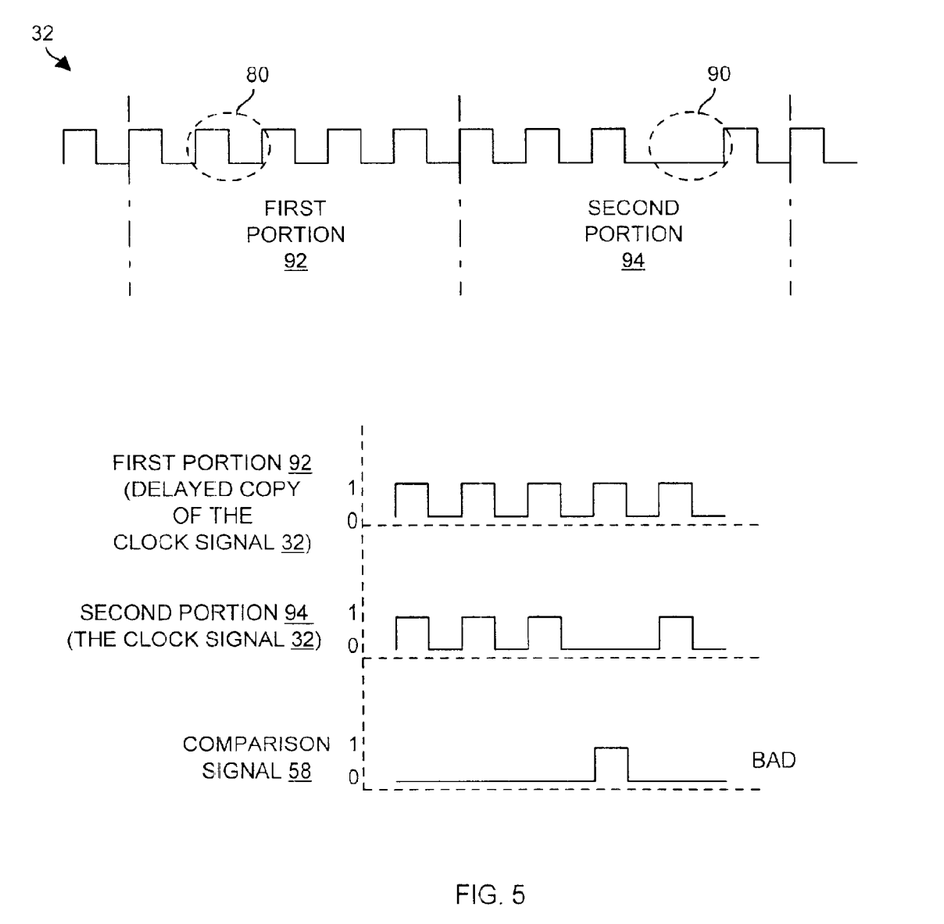
FIG. 5 is a timing diagram of the clock signal tested by the test circuit of FIG. 1 when the clock signal fails the test.

FIG. 5 shows an example of how the comparison circuit 42 of FIG. 2 operates when the clock signal 32 becomes unstable. As shown in FIG. 5, the clock signal 32 includes mostly uniform waveforms 80 but misses a clock pulse in a particular clock cycle 90. This situation could occur in response to a number of factors such as operating in an extreme environment, aging of a clock crystal, etc. Initially and as shown in the lower timing diagram of FIG. 5, the compare circuitry 48 provides a comparison signal 58 which indicates that the clock signal 32 is acceptable because the first few clock cycles of the delayed clock signal 56 (see the first portion 92) and the clock signal 32 (see the second portion 94) match. However, when the compare circuitry 48 compares the fourth clock cycle of the delayed clock signal 56 with the fourth clock cycle of the actual clock signal 32 (i.e., the clock cycle missing the clock pulse), the compare circuitry 48 outputs the comparison signal 58 indicating a mismatch. That is, the comparison signal 58 transitions from a de-asserted level to an asserted level indicating an irregularity with the clock signal 32 (e.g., "BAD").

Figure 6:
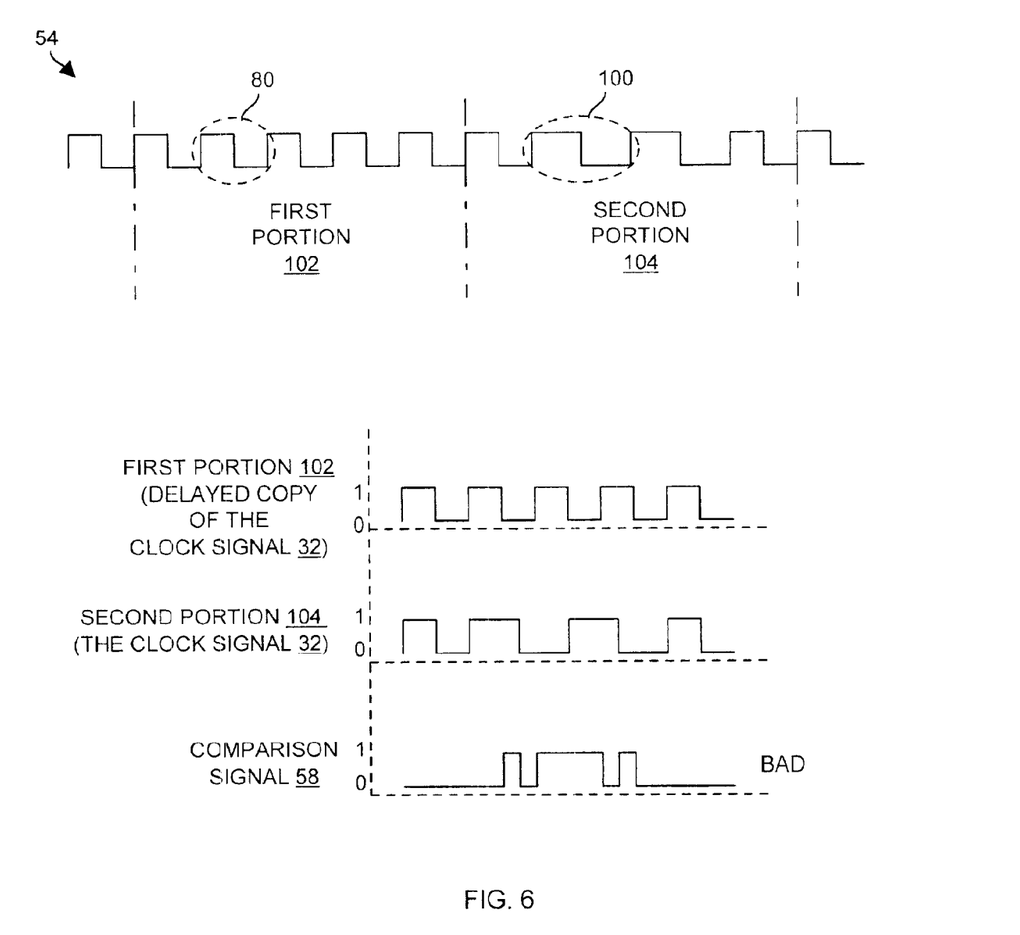
FIG. 6 is another timing diagram of the clock signal tested by the test circuit of FIG. 1 when the clock signal fails the test.

FIG. 6 shows another example of how the comparison circuit 42 of FIG. 2 operates when the clock signal 32 becomes unstable. As shown in FIG. 6, the clock signal 32 initially includes uniform waveforms 80 but subsequently provides two abnormally long waveforms 100. Again, this situation could occur in response to a number of factors such as aging of a clock crystal, poor quality components, etc. At first and as shown in the lower timing diagram of FIG. 6, the compare circuitry 48 provides a comparison signal 58 which indicates that the clock signal 32 is acceptable because the first clock cycle of the delayed clock signal 56 (see the first portion 102) and the clock signal 32 (see the second portion 104) match. However, when the compare circuitry 48 compares the second and third clock cycles of the delayed clock signal 56 with the second and third clock cycles of the actual clock signal 32 (i.e., the elongated clock cycles), the compare circuitry 48 outputs the comparison signal 58 indicating a mismatch. That is, the comparison signal 58 transitions from the de-asserted level to the asserted level during instances when the delayed clock signal 56 and the clock signal 32 do not match thus indicating an anomaly with the clock signal 32 (e.g., "BAD").

It should be understood that there may be small differences and abnormalities in the clock signal 32 that are acceptable. The output circuit 44 provides post processing of the comparison signal 58 to build some operating margin into the test circuit 24 in order to make such small irregularities acceptable. In particular, the tuning circuit 50 (see FIG. 2) provides hysteresis to the comparison signal 58 to tune out small variations caused by jitter, duty cycle distortion, etc. in the clock signal 32. Furthermore, the trigger circuit 52 provides, as the result signal 60, a controlled signal when the test circuit 24 determines that the clock signal 32 is unacceptable. Further details of the invention will now be provided with reference to FIG. 7.

Figure 7:
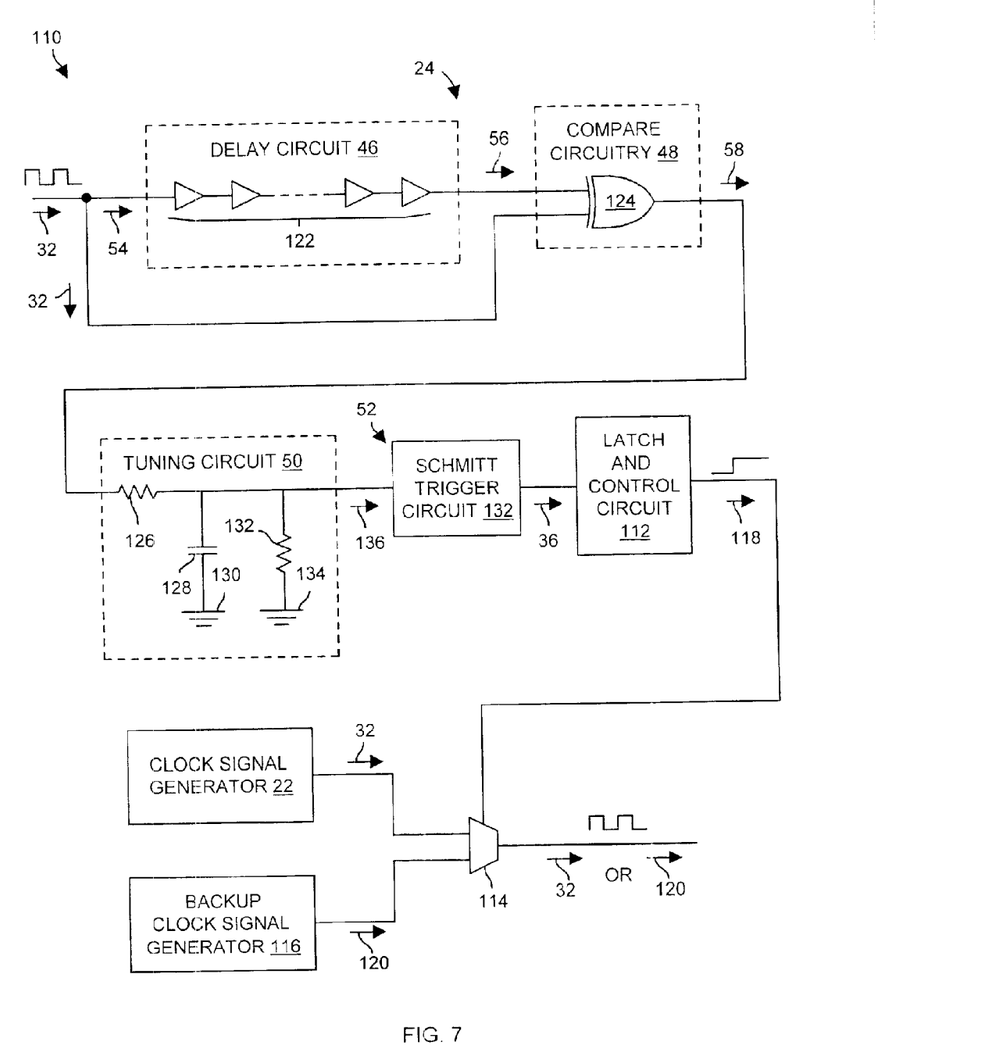
FIG. 7 is a more detailed block diagram of the test circuit of FIG. 2 and additional circuitry controlled by the test circuit.

FIG. 7 provides a more detailed view 110 of the test circuit 24, as well as illustrates how the result signal 36 provided by the test circuit 24 can be used to control another circuit (e.g., another device, component, etc.). In the circuit diagram of FIG. 7, the output of the test circuit 24 connects to a latch and control circuit 112. The output of the latch and control circuit 112 controls a multiplexer 114 having a first input that connects to the clock signal generator 22, and a second input that connects to a backup clock signal generator 116. In one arrangement, the clock signal generator 22 and the backup signal generator 116 include simple off-the-shelf clock oscillators for generating clock signals.

During operation, the test circuit 24 tests the clock signal 32 by comparing the clock signal 32 to a delayed copy 56 of itself. As long as the clock signal 32 and the delayed copy 56 instantaneously match, the test circuit 24 provides, as the result signal 36, a de-asserted logic level to the latch and control circuit 112. In turn, the latch and control circuit 112 directs the multiplexer 114 to output the clock signal 32. However, if the test circuit 24 determines that the clock signal 32 has become unacceptable due to a mismatch between the clock signal 32 and the delayed copy 56, the test circuit 24 provides, as the result signal 36, a signal (a temporary asserted logic level) to the latch and control circuit 112. The latch and control circuit 112 responds by directing the multiplexer 114 to provide a clock signal 120 from the backup clock signal generator 116 rather than continue to provide the clock signal 32. Accordingly, the test circuit 24 is capable of controlling other circuitry, such as the latch and control circuit 112 that switches to a backup clock signal 120 in response to an indication that the original clock signal 32 has become unacceptable.

As further shown in FIG. 7 and by way of example only, the delay circuit 46 includes a set of delayed buffers 122 arranged in a cascading configuration. The set of delay buffers 122 delays the copy 54 of the clock signal 32 by an integer multiple of clock periods.

By way of example, the compare circuitry 48 includes an XOR circuit 124. Accordingly, when the clock signal 32 and the delayed copy 56 of the clock signal 32 instantaneously match, the comparison signal 58 outputted by the compare circuitry 48 is at a de-asserted level. However, when the clock signal 32 and the delayed copy 56 of the clock signal 32 do not instantaneously match, the comparison signal 58 changes to an asserted level (also see FIGS. 5 and 6).

Furthermore, the tuning circuit 50 includes, by way of example, an RC circuit. This RC circuit includes a resistor 126 and a capacitor 128 coupled in series between the output of the compare circuitry 48 and a ground 130. The RC circuit further includes another resistor 132 which is coupled between the midpoint connection of the capacitor 128 and the resistor 126 and a ground 134. Initially, the capacitor 128 includes no charge. During operation of the test circuit 24, the capacitor 128 charges through the resistor 126, i.e., when the comparison signal 58 indicates that the clock signal 32 no longer matches the delayed copy 56 of the clock signal 32. When the capacitor 128 charges beyond a particular threshold, the tuning circuit 50 activates the trigger circuit 52.

It should be understood that the tuning effect provided by the tuning circuit 50 can be controlled by adjusting the RC time constant, i.e., the rate at which the capacitor 128 charges can be controlled by adjusting the values of the resistor 126 and the capacitor 128. The resistor 132 discharges the capacitor 128 to prevent the voltage across the capacitor 128 from building up over an extended period of time. For example, in some situations where there are only insignificant differences between the clock signal 32 and the delayed copy 56 of the clock signal 32 (e.g., minor jitter, duty cycle distortion, etc.), the resistor 132 (a high resistance such as 10 Mohms) has an opportunity to discharge the capacitor 128 (i.e., "bleed off" the capacitor 128) to avoid activating the trigger circuit 52. Accordingly, the tuning circuit 50 essentially provides a tuned or filtered version 136 of the comparison signal 158 to the trigger circuit 52.

By way of example only, the trigger circuit 52 includes a Schmitt trigger circuit 132 which provides a pulse, as the result signal 36, when the tuned version 136 of the comparison signal 158 provides a signal beyond the particular threshold. Accordingly, the trigger circuit 52 provides a glitch-free result signal 36 which is suitable for controlling other circuitry.

As described above, the invention provides a higher level of checking than simply reporting whether a clock signal is present, as in conventional computer systems. Rather, the invention is directed to techniques for testing a clock signal 32 by comparing different portions of that clock signal 32 to each other. Such techniques enable the detection of clock signal irregularities such as a clock signal having missing pulses or having occasional delayed pulses. Additionally, the invention can be implemented using simple, low cost components (e.g., delay buffers, an XOR gate, an RC circuit, etc.). Complex circuits such as Phase-locked Loops are unnecessary. The features of the invention may be particularly useful in computer systems, and computer-related components such as those of Cisco Systems, Inc. of San Jose, Calif.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the delay circuit 46 was described as including a set of delayed buffers 122 by way of example only. Other delay mechanisms are suitable for use by the invention as well such as a voltage controlled delay line, an ASIC trace, an extended copper trace, and the like.

Additionally, it should be understood that the compare circuitry 48 was described as including an XOR circuit 124 by way of example only. Other circuit designs are suitable for use as well such as a comparator, control logic, analog circuitry, etc.

Furthermore, it should be understood that the tuning circuit 50 was described as including an RC circuit by way of example only. Other circuits are suitable for use as well such as more sophisticated analog circuitry, and the like. The tuning circuit 50, in its various forms, allows for different levels of accuracy depending on application and cost.

Additionally, it should be understood that the trigger circuit 54 was described as including a Schmitt trigger circuit 132 by way of example only. Other circuits are suitable for use as well such as a latch, a flip-flop, and the like. The square pulse provided by the trigger circuit 54 was provided by way of example only. Circuits other than a Schmitt trigger can be used within the trigger circuit 54 to provide, as the result signal 36, an output signal shaped to whatever a particular application requires.

Furthermore, it should be understood that the result signal 36 was described as controlling the use of a backup clock signal generator 116 by way of example only. The result signal 36 is suitable for use in other applications as well. In one arrangement, the result signal 36 activates a warning device (e.g., lights an LED, records a message into a log file, activates an alarm, sends a warning message to a remote computer, etc.) when the clock signal 32 becomes unacceptable. In another arrangement, the result signal 36 starts a software implemented error handling procedure when the clock signal 32 becomes unacceptable.

Additionally, it should be understood that clock signal 32 tested by the invention was described as a system clock by way of example only. The clock signal 32 does not need to be a system clock. Rather, the signal 32 can be used for functions other than synchronizing the operation of a computer system (e.g., clock or clock-related functions through a backplane, signal synchronization through network channels, etc.). The signal 32 can be an external clock received from an external device together with data in a data stream. Also, the clock signal 32 does not need to have a traditional 50% duty cycle. It can be any signal having a regular or repeating waveform (e.g., a repeating binary code of 1's and 0's).

Furthermore, if the signal under test is a high speed signal, the signal can be divided down and the divided-down derivative signal can be tested by the invention. It should be understood that, when testing the divided-down derivative, there is a greater likelihood that some situations may arise where a signal irregularity will go undetected (e.g., a missing pulse may go undetected but a series of missing pulses will be detected, etc.).

Additionally, it should be understood that the signal under test can reside on media other than a traditional circuit board. For example, the invention can be implemented to test backplane signals, cable signals, fiber optic signals, etc. As another example, the invention can completely reside in a single integrated circuit e.g., an application specific integrated circuit (ASIC).

Furthermore, it should be understood that FIG. 7 shows two clock signal generators 22, 116 by way of example only. More than two clock signal generators can be included/controlled for additional fault tolerance (e.g., to improve the mean time between failures). Such modifications and enhancements are intended to be part of the invention.

What is claimed is:

1. A method for testing a clock signal, comprising the steps of:
   receiving a clock signal, the clock signal originating from a first clock signal generator;
   generating a comparison between the clock signal and a delayed copy of the clock signal, the step of generating the comparison including the step of comparing an initial portion of the clock signal to a subsequent portion of the clock signal to identify irregularities in the clock signal;
   providing a result signal based on the comparison between the clock signal and the delayed copy of the clock signal; and
   maintaining selection of the first clock signal generator when the result signal has a first value, and switching selection from the first clock signal generator to a second clock signal generator when the result signal has a second value.

2. The method of claim 1 wherein the step of comparing includes the steps of:
   delaying a copy of the clock signal for a predetermined time interval to form the delayed copy of the clock signal; and
   comparing the clock signal with the delayed copy of the clock signal to compare the initial portion with the subsequent portion.

3. The method of claim 2 wherein the step of delaying includes the step of passing the copy of the clock signal through a set of delay buffers.

4. The method of claim 2 wherein the step of delaying includes the step of passing the copy of the clock signal through an elongated trace of conductive material.

5. The method of claim 1 wherein the step of providing the result signal includes the step of:
   providing a comparison signal, which indicates the comparison between the clock signal and the delayed copy of the clock signal, to a trigger circuit having an output that outputs the result signal, the result signal having a constant level when the clock signal and the delayed copy of the clock signal match and a square pulse when the clock signal and the delayed copy of the clock signal do not match.

6. The method of claim 1 wherein the step of providing includes the step of:
   outputting, as the result signal, (i) a first signal value when the initial portion of the clock signal substantially matches the subsequent portion of the clock signal, and (ii) a second signal value when the initial portion of the clock signal substantially does not match the subsequent portion of the clock signal.

7. The method of claim 1 wherein the step of receiving includes the step of:
   obtaining the clock signal from a terminal connected to an input of an operating circuit that operates in a normal operating mode during the steps of generating the comparison and providing the result signal.

8. The method of claim 7 wherein the operating circuit includes data communications circuitry that receives data elements through a set of input ports and transmits the data elements through a set of output ports in response to the clock signal, and wherein the steps of receiving, generating and providing occur concurrently in an ongoing manner and while the data communications circuitry receives data elements through the set of input ports and transmits the data elements through the set of output ports in response to the clock signal.

9. The method of claim 1 wherein maintaining and switching include the step of:
   directing an output circuit to provide (i) the clock signal from the first clock signal generator when the result signal has a first value indicating correctness of the clock signal from the first clock signal generator, and (ii) a backup signal when the result signal has a second value indicating incorrectness of the clock signal from the first clock signal generator.

10. A method for testing a clock signal, comprising the steps of:
    receiving a clock signal;
    generating a comparison between the clock signal and a delayed copy of the clock signal; and providing a result signal based on the comparison between the clock signal and the delayed copy of the clock signal, wherein the step of generating the comparison includes the step of:
    providing the clock signal to a first input of an XOR circuit; and
    providing the delayed copy of the clock signal to a second input of the XOR circuit, the output of the XOR circuit providing an output signal having an asserted level when the clock signal and the delayed copy of the clock signal do not instantaneously match, and a de-asserted level when the clock signal and the delayed copy of the clock signal instantaneously match.

11. A method for testing a clock signal, comprising the steps of:
    receiving a clock signal;
    generating a comparison between the clock signal and a delayed copy of the clock signal; and providing a result signal based on the comparison between the clock signal and the delayed copy of the clock signal, wherein the step of providing the result signal includes the step of:
    providing a comparison signal, which indicates the comparison between the clock signal and the delayed copy of the clock signal, to an RC circuit having an output that provides a tuned signal based on the comparison signal.

12. A test circuit for testing a clock signal, comprising:
a node that receives a clock signal, the clock signal originating from a first clock signal generator;
a comparison circuit, coupled to the node, that provides a comparison signal based on a comparison between the clock signal and a delayed copy of the clock signal; the comparison circuit, when providing the comparison signal being configured to compare an initial portion of the clock signal to a subsequent portion of the clock signal to identify irregularities in the clock signal; and
an output circuit, coupled to the comparison circuit, that provides a result signal based on the comparison signal; the reset signal provided by the output circuit being configured to maintain selection of the first clock signal generator when the result signal has a first value, and switch selection from the first clock signal generator to a second clock signal generator when the result signal has a second value.

13. The test circuit of claim 12 wherein the comparison circuit includes:
a delay circuit that delays a copy of the clock signal for a predetermined time interval to form the delayed copy of the clock signal; and
compare circuitry, coupled to the delay circuit, that compares the clock signal with the delayed copy of the clock signal to compare the initial portion with the subsequent portion.

14. The test circuit of claim 13 wherein the delay circuit includes a set of delay buffers connected in a cascading manner.

15. The test circuit of claim 13 wherein the delay circuit includes an elongated trace of conductive material.

16. The test circuit of claim 13 wherein the output circuit, when providing the result signal, is configured to:
output, as the result signal, (i) a first signal value when the initial portion of the clock signal substantially matches the subsequent portion of the clock signal, and (ii) a second signal value when the initial portion of the clock signal substantially does not match the subsequent portion of the clock signal.

17. The test circuit of claim 12 wherein the output circuit includes:
a trigger circuit having an input coupled to the comparison circuit, and an output that outputs the result signal, the result signal having a constant level when the clock signal and the delayed copy of the clock signal match and a square pulse when the clock signal and the delayed copy of the clock signal do not match.

18. A test circuit for testing a clock signal, comprising:
a node that receives a clock signal;
a comparison circuit, coupled to the node, that provides a comparison signal based on a comparison between the clock signal and a delayed copy of the clock signal; and
an output circuit, coupled to the comparison circuit, that provides a result signal based on the comparison signal, wherein the comparison circuit includes:
an XOR circuit having a first input that receives the clock signal, a second input that receives the delayed copy of the clock signal, and an output that provides an output signal having an asserted level when the clock signal and the delayed copy of the clock signal do not instantaneously match, and a de-asserted level when the clock signal and the delayed copy of the clock signal instantaneously match.

19. A test circuit for testing a clock signal, comprising:
a node that receives a clock signal;
a comparison circuit, coupled to the node, that provides a comparison signal based on a comparison between the clock signal and a delayed copy of the clock signal; and
an output circuit, coupled to the comparison circuit, that provides a result signal based on the comparison signal, wherein the output circuit includes:
an RC circuit having an input coupled to the comparison circuit, and an output that provides a tuned signal based on the comparison signal.

20. A data communications device, comprising:
a first clock signal generator that provides a clock signal;
processing circuitry, coupled to the first clock signal generator, that uses the clock signal to receive data elements on a set of input ports, and to transmit the data elements on a set of output ports; and
a test circuit, coupled to the first clock signal generator, that tests the clock signal provided by the first clock signal generator, the test circuit including (i) a node that receives the clock signal, (ii) a comparison circuit, coupled to the node, that provides a comparison signal based on a comparison between the clock signal and a delayed copy of the clock signal, and (iii) an output circuit, coupled to the comparison circuit, that provides a result signal based on the comparison signal,
wherein the comparison circuit, when providing the comparison signal, is configured to compare an initial portion of the clock signal to a subsequent portion of the clock signal to identify irregularities in the clock signal, and
wherein the reset signal provided by the output circuit is configured to maintain selection of the first clock signal generator when the result signal has a first value, and switch selection from the first clock signal generator to a second clock signal generator when the result signal has a second value.

21. The data communications device of claim 20 wherein the comparison circuit includes:
a delay circuit that delays a copy of the clock signal for a predetermined time interval to form the delayed copy of the clock signal; and
compare circuitry, coupled to the delay circuit, that compares the clock signal with the delayed copy of the clock signal to compare the initial portion with the subsequent portion.

22. The data communications device of claim 21 wherein the delay circuit includes a set of delay buffers connected in a cascading manner.

23. The data communications device of claim 21 wherein the delay circuit includes an elongated trace of conductive material.

24. The data communications device of claim 20 wherein the output circuit of the test circuit, when providing the result signal, is configured to:
output, as the result signal, (i) a first signal value when the initial portion of the clock signal substantially matches the subsequent portion of the clock signal, and (ii) a second signal value when the initial portion of the clock signal substantially does not match the subsequent portion of the clock signal.

25. A data communications device, comprising:
a clock signal generator that provides a clock signal;
processing circuitry, coupled to the clock signal generator, that uses the clock signal to receive data elements on a set of input ports, and to transmit the data elements on a set of output ports; and a test circuit, coupled to the clock signal generator, that tests the clock signal provided by the clock signal generator, the test circuit including (i) a node that receives the clock signal, (ii) a comparison circuit, coupled to the node, that provides a comparison signal based on a comparison between the clock signal and a delayed copy of the clock signal, and (iii) an output circuit, coupled to the comparison circuit, that provides a result signal based on the comparison signal, wherein the comparison circuit includes:

an XOR circuit having a first input that receives the clock signal, a second input that receives the copy of the clock signal, and an output that provides an output signal having an asserted level when the clock signal and the delayed copy of the clock signal do not instantaneously match, and a de-asserted level when the clock signal and the delayed copy of the clock signal instantaneously match.

26. A data communications device, comprising:

a clock signal generator that provides a clock signal;

processing circuitry, coupled to the clock signal generator, that uses the clock signal to receive data elements on a set of input ports, and to transmit the data elements on a set of output ports; and a test circuit, coupled to the clock signal generator, that tests the clock signal provided by the clock signal generator, the test circuit including (i) a node that receives the clock signal, (ii) a comparison circuit, coupled to the node, that provides a comparison signal based on a comparison between the clock signal and a delayed copy of the clock signal, and (iii) an output circuit, coupled to the comparison circuit, that provides a result signal based on the comparison signal, wherein the output circuit includes:

an RC circuit having an input coupled to the comparison circuit, and an output that provides a tuned signal based on the comparison signal.

* * * * *